(12) United States Patent
Hsiao et al.

(10) Patent No.: US 8,422,238 B2
(45) Date of Patent: Apr. 16, 2013

(54) SIGNAL CONVERSION DEVICE

(75) Inventors: Feng Chi Hsiao, Taipei (TW); Kun Shan Yang, Taipei (TW); Tung Fu Lin, Taipei (TW); Chin Fen Cheng, Taipei (TW); Chih Wei Lee, Taipei (TW)

(73) Assignee: Phytrex Technology Corporation, Taipei (TW)

( * ) Notice: Subject to any disclaimer, the term of this patent is extended or adjusted under 35 U.S.C. 154(b) by 253 days.

(21) Appl. No.: 12/759,223

(22) Filed: Apr. 13, 2010

(65) Prior Publication Data

US 2010/0259904 A1    Oct. 14, 2010

(30) Foreign Application Priority Data

Apr. 13, 2009  (TW) .............................. 98206043 U

(51) Int. Cl.
*H05K 1/00* (2006.01)
*H05K 1/18* (2006.01)
*H05K 7/00* (2006.01)

(52) U.S. Cl.
USPC ......................................................... 361/748

(58) Field of Classification Search ........................ None
See application file for complete search history.

(56) References Cited

U.S. PATENT DOCUMENTS

| | | | | |
|---|---|---|---|---|
| 4,549,200 A * | 10/1985 | Ecker et al. | .................... | 174/260 |
| 4,661,214 A * | 4/1987 | Young | ............................ | 205/123 |
| 5,534,372 A * | 7/1996 | Koshizuka et al. | ............. | 430/10 |
| 5,837,367 A * | 11/1998 | Ortiz et al. | .................... | 428/332 |
| 5,880,934 A * | 3/1999 | Haghiri-Tehrani | ........... | 361/737 |
| 5,973,927 A * | 10/1999 | Tanaka | .......................... | 361/760 |
| 6,025,997 A * | 2/2000 | Huber et al. | .................. | 361/777 |
| 6,076,737 A * | 6/2000 | Gogami et al. | ................ | 235/492 |
| 6,095,423 A * | 8/2000 | Houdeau et al. | .............. | 235/487 |
| 6,188,580 B1 * | 2/2001 | Huber et al. | .................. | 361/737 |
| 6,191,951 B1 * | 2/2001 | Houdeau et al. | .............. | 361/737 |
| 6,886,246 B2 * | 5/2005 | Chung | ............................ | 29/832 |
| 7,171,503 B2 * | 1/2007 | Lee et al. | ....................... | 710/300 |
| 7,352,588 B2 * | 4/2008 | Nishizawa et al. | ............ | 361/737 |
| 7,558,110 B2 * | 7/2009 | Mizushima et al. | ...... | 365/185.04 |
| 7,874,491 B2 * | 1/2011 | Janke et al. | ................... | 235/492 |
| 8,107,246 B2 * | 1/2012 | Fidalgo et al. | ................ | 361/737 |
| 2003/0016507 A1 * | 1/2003 | Fischer et al. | ................ | 361/737 |
| 2005/0231921 A1 * | 10/2005 | Noda et al. | .................... | 361/737 |
| 2006/0191215 A1 * | 8/2006 | Stark | ............................ | 52/204.6 |
| 2008/0030963 A1 * | 2/2008 | Middlekauff et al. | ........ | 361/737 |
| 2008/0062657 A1 * | 3/2008 | Seo et al. | ....................... | 361/748 |
| 2008/0151511 A1 * | 6/2008 | Martinson et al. | ............ | 361/748 |
| 2008/0217761 A1 * | 9/2008 | Yang et al. | .................... | 257/700 |
| 2008/0251905 A1 * | 10/2008 | Pope et al. | .................... | 257/679 |
| 2009/0154132 A1 * | 6/2009 | Okamoto et al. | ............. | 361/804 |

(Continued)

*Primary Examiner* — Lisa Lea Edmonds
*Assistant Examiner* — Xanthia C Cunningham
(74) *Attorney, Agent, or Firm* — Morris Manning & Martin LLP; Tim Tingkang Xia, Esq.

(57) ABSTRACT

The present invention provides a signal conversion device comprising: a substrate having a first surface and a second surface, the first surface being provided with a first contact region comprising at least a first contact and a second contact while the second surface being provided with a second contact region comprising at least a third contact and a fourth contact; wherein there is an electrical connection between the first and third contacts, and the second and fourth contacts are electrically connected to an IC fabricated using Wafer Level Chip Scale Package (WLCSP) or Chip On Film (COF) technology, and wherein the IC is disposed at the first surface or the second surface.

16 Claims, 8 Drawing Sheets

U.S. PATENT DOCUMENTS

2009/0196010 A1* 8/2009 Nakasato et al. ............ 361/820
2009/0196011 A1* 8/2009 Kobayashi et al. ........... 361/820
2009/0218698 A1* 9/2009 Lam .............................. 257/773
2009/0290320 A1* 11/2009 Song ............................. 361/818

* cited by examiner

SIGNAL CONVERSION DEVICE

BACKGROUND OF THE INVENTION

1. Field of the Invention

The present invention relates to a signal conversion device applicable to the Subscriber Identify Module (SIM), and more particularly, to the technical field regarding the integration of dual cards.

2. Description of the Prior Art

With the internationalization of corporations, efficiency is the key to competing successfully in the global market, thus the mobile phone has become the most important gadget for businessmen/women. For one who is about to embark on a short-term business trip, s/he needs to get a phone number from a local telecommunication service provider so as to save international roaming fees. In the past, a businessman/woman either carried two mobile phones or swapped SIM cards repetitively while on a business trip abroad, and that was not only inconvenient but also inefficient. Today, both mobile network operators and telecommunication service providers provide services regarding dual SIM mobile phones so as to facilitate reducing international mobile phone fees. Currently, a SIM card is used in a mobile phone to store the user's phone number, phone book and system information, such as the Personal Identification Number (PIN) code and user ID, and to perform antitheft function, access control function, etc. However, people's heavy reliance on mobile phones gives rise to the needs to integrate the near field communication (NFC) functions, such as the functions of EasyCard, credit card and entrance card, into a SIM card, and this means the SIM card requires a greater capacity. The SIM Application Toolkit (STK) is a standard of the Global System for Mobile Communications (GSM), which defines the interface between a SIM card and a mobile phone as well as the operating procedure. Specifically, the STK is a standard interface tool for developing application service on a SIM card that enables applications in the SIM card to be operated by any mobile phone.

Among the developed technologies is a technology that employs the flexible printed circuit (FPC) technology to fabricate a smart card. Accordingly, the smart card can be seamlessly attached to the SIM card provided by another telecommunication service provider and then be inserted into the mobile phone along with the SIM card. The smart card comprises an IC chip loaded with software that enhances a SIM card's functionality, facilitates the integration of relevant value-added services and enables the user to shift between different phone numbers by means of the STK. According to the prior technologies, the IC chip of the smart card is attached to the flexible printed circuit board by means of the flip-chip technology. However, the prior art technologies involve processing the SIM card from the telecommunication service provider due to the thinness of the IC chip. In other words, forming an opening on the SIM card to which the smart card is to be attached is required, and the opening should conform to the size of the IC chip so that the IC chip can be snapped therein seamlessly. The requirement of an opening means the SIM card to which the smart card is to be attached must undergo a destructive procedure, and this may provoke disputes between the user and the telecommunication service provider later on, causing much inconvenience to the user.

SUMMARY OF THE INVENTION

An object of the present invention is to provide a signal conversion device whose mating configuration permits dual cards to be used in a single mobile phone or enables information processing functions to be added to a SIM card without changing the structure of the SIM card.

To achieve the aforementioned object, the present invention provides a signal conversion device comprising: a substrate having a first surface and a second surface, the first surface being provided with a first contact region comprising at least a first contact and a second contact while the second surface being provided with a second contact region comprising at least a third contact and a fourth contact; wherein there is an electrical connection between the first and third contacts, and the second and fourth contacts are electrically connected to an IC fabricated using Wafer Level Chip Scale Package (WLCSP) technology, and wherein the IC is disposed at the first surface or the second surface.

To achieve the aforementioned object, the present invention provides a signal conversion device comprising: a substrate having a first surface and a second surface, the first surface being provided with a first contact region comprising at least a first contact and a second contact while the second surface being provided with a second contact region comprising at least a third contact and a fourth contact; wherein there is an electrical connection between the first and third contacts, and the second and fourth contacts are electrically connected to an IC fabricated using Chip On Film (COF) technology, and wherein the IC is disposed at the first surface or the second surface.

DETAILED DESCRIPTION OF THE PREFERRED EMBODIMENTS

Figure 1:
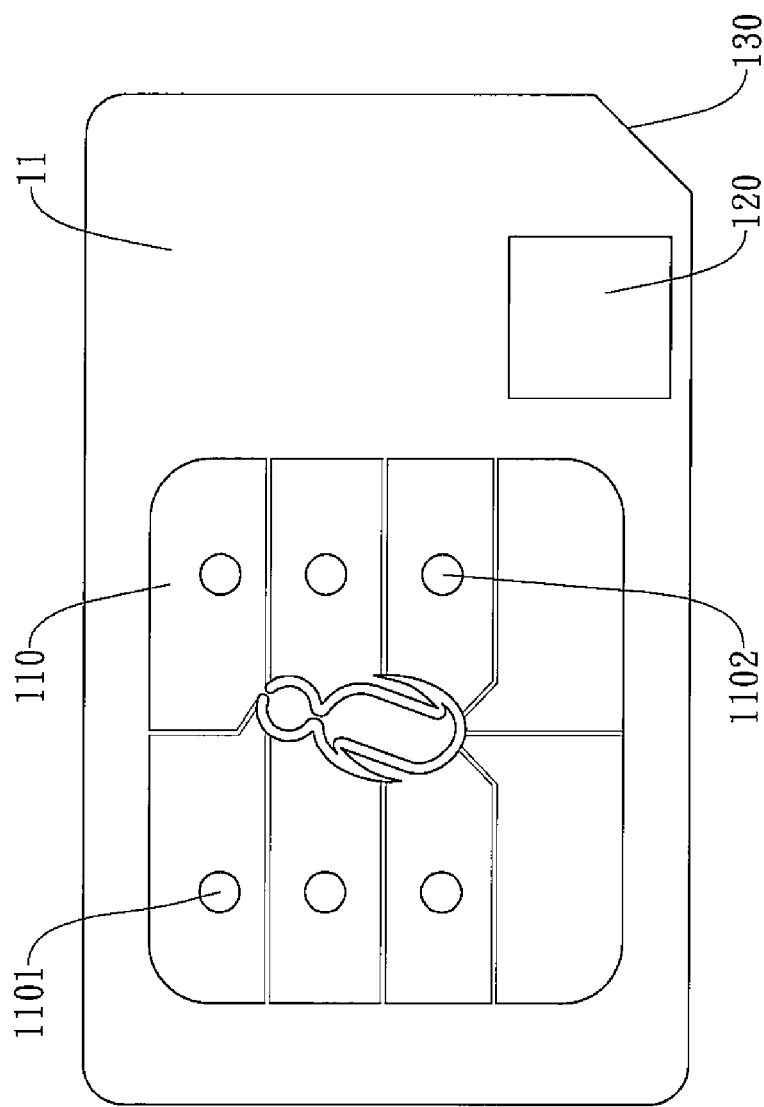
FIG. 1 is a frontal view of one embodiment of the present invention.

FIG. 1 is a frontal view of one embodiment of the present invention. As shown in FIG. 1, the present signal conversion device for converting at least a portion of the signals between a SIM/USIM card and a mobile phone comprises a substrate 11 fabricated using the FPC technology. An edge 130 of the substrate 11 has a foolproof design. In one preferred embodiment of the present invention, the appearance design of the substrate 11 is the same as that of the SIM card to which the substrate 11 is to be attached so that the substrate 11 can be completely adhered to the SIM card. A second surface (i.e. the frontal surface) of the substrate 11 is provided with a second contact region 110 comprising at least a third contact 1101 and a fourth contact 1102 which are configured to electrically connect to a portable communication device (e.g. a mobile phone). In this embodiment, the second contact region 110 comprises eight contacts (C1. Vcc, C2. RST, C3. CLK, C4. RFU, C5. GND, C6. Vpp, C7. I/O, C8. RFU) that meet ISO 7816 international standards, wherein C1. Vcc and C5. GND may be regarded as the third contact 1101 while C7. I/O may be regarded as the fourth contact 1102.

Figure 2:
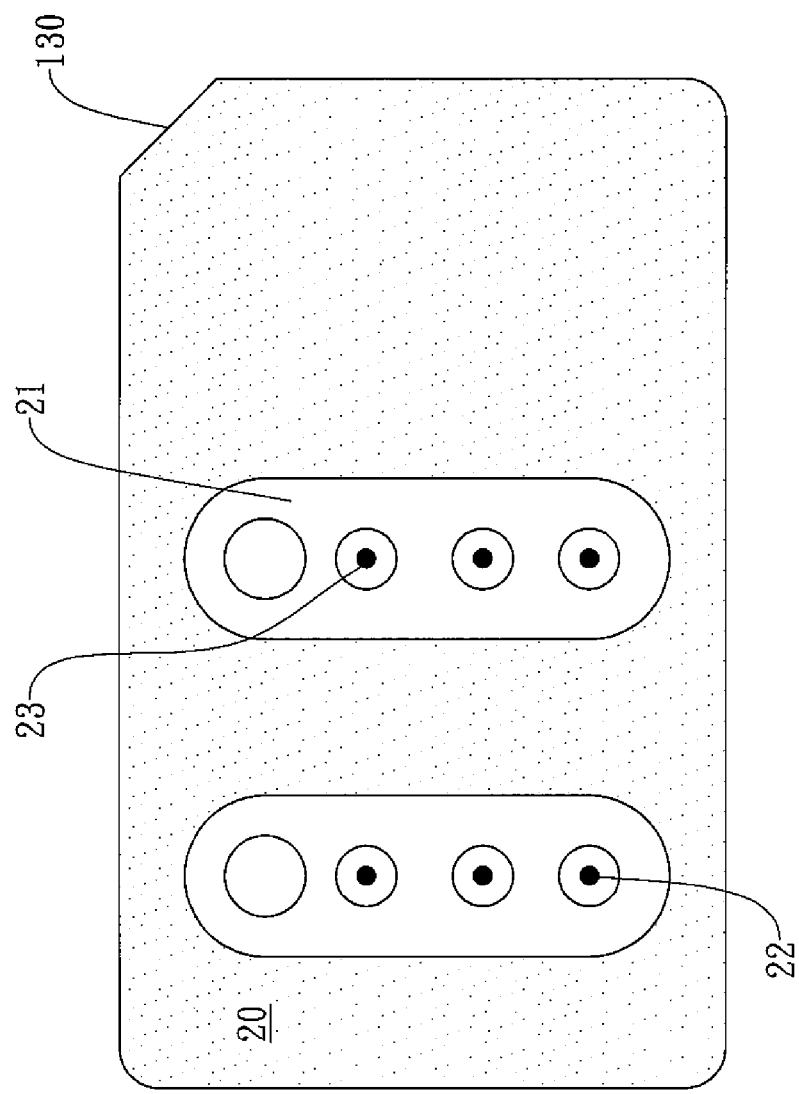
FIG. 2 is a rear view of the embodiment shown in FIG. 1.

FIG. 2 is a rear view of the embodiment shown in FIG. 1. A first surface (i.e. the rear surface) of the substrate 11 is provided with a first contact region 21 comprising at least a first contact 22 and a second contact 23, wherein there is an electrical connection between the first contact 22 and the third contact 1101. In one embodiment of the present invention, the contacts of the first contact region 21 also meet ISO 7816 international standards, and the locations thereof correspond to the locations of the contacts of the second contact region 110, wherein C1. Vcc and C5. GND may be regarded as the first contact 22 while C7. I/O may be regarded as the second contact 23. Still referring to FIG. 2, in one embodiment of the present invention, an IC 120 fabricated using WLCSP or COF technology is disposed at the second surface (i.e. the frontal surface) and positioned between the second contact region 110 and the edge 130 having the foolproof design. The second contact 23 and the fourth contact 1102 are electrically connected to the IC 120 and the signals (e.g. data signals) therebetween are converted by the IC 120.

Figure 3:
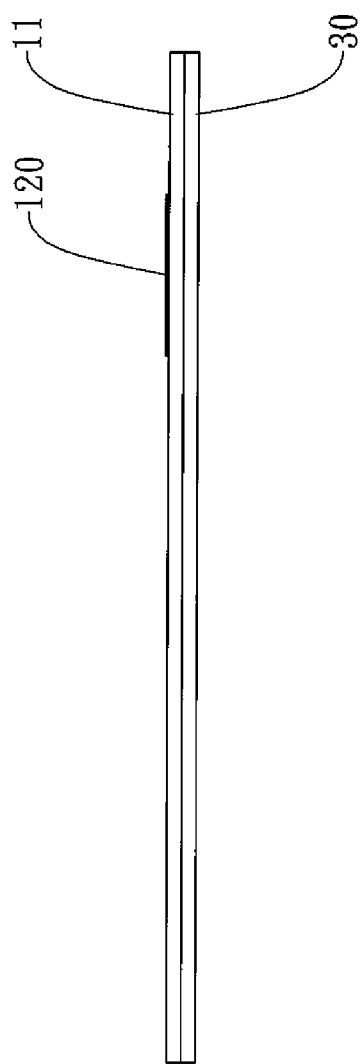
FIG. 3 is a side view showing the embodiment shown in FIG. 1 and a SIM card.

FIG. 3 is a side view showing the embodiment shown in FIG. 1 and a SIM card. The first contact 22 and the second contact 23 are configured to electrically connect to a SIM card 30. Additionally, a dotted region 20 of the first surface is coated with an adhesive material so that the first surface can be adhered to the SIM card 30.

Figure 4:
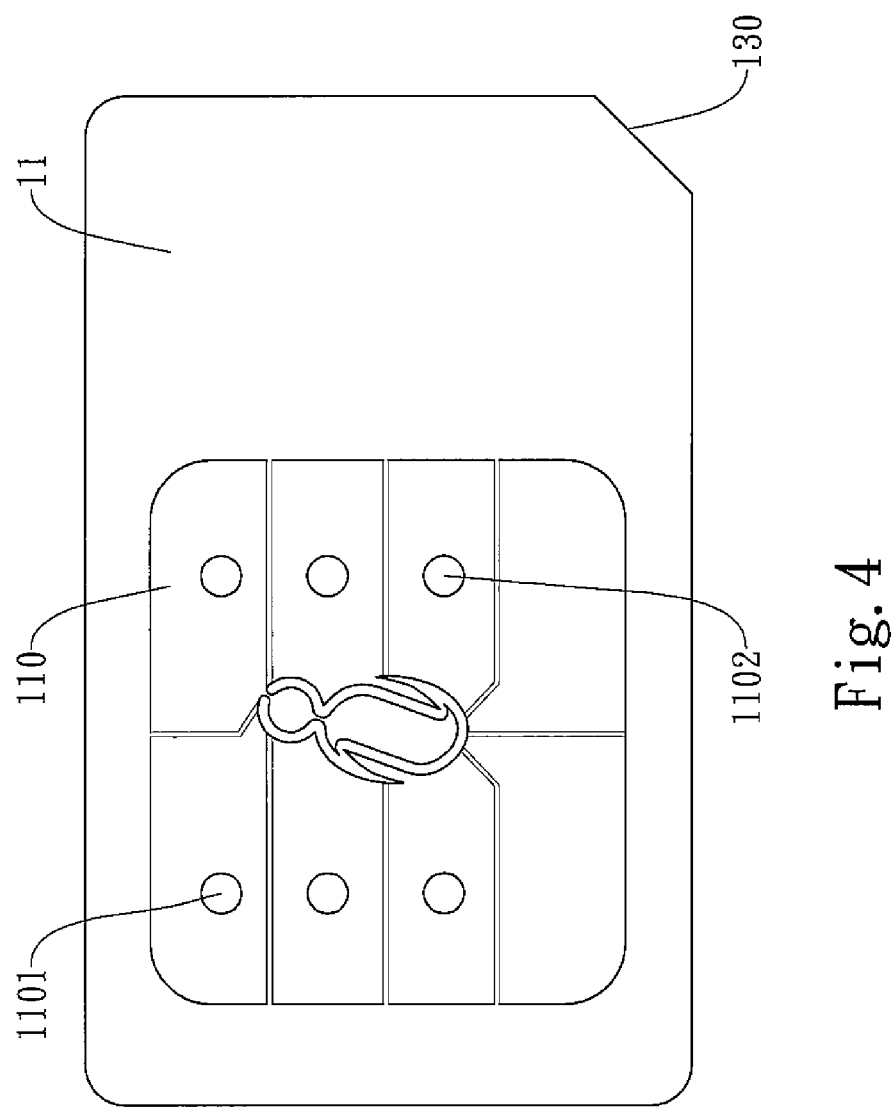
FIG. 4 is a frontal view of another embodiment of the present invention.
Figure 5:
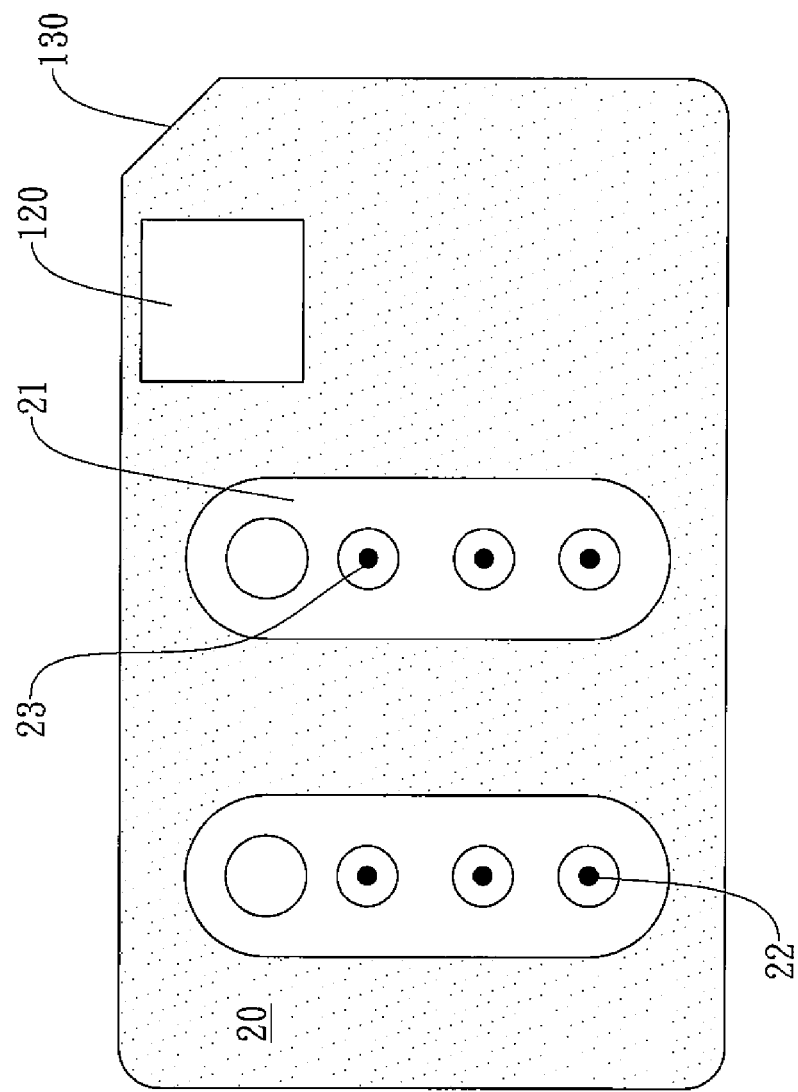
FIG. 5 is a rear view of the embodiment shown in FIG. 4.
Figure 6:
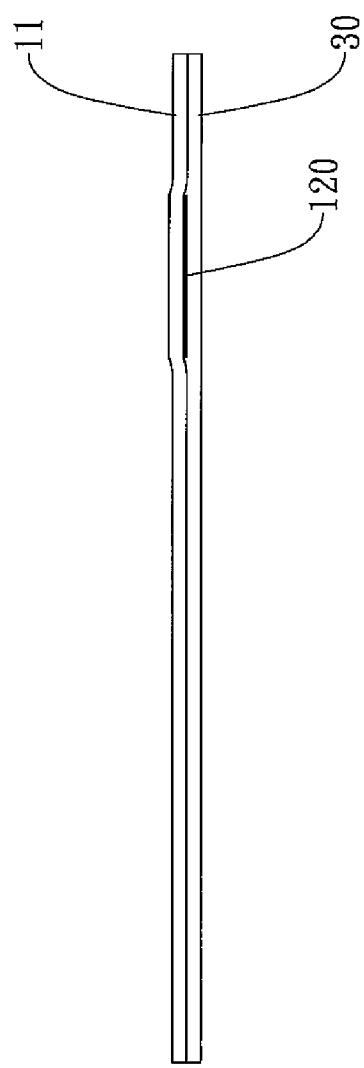
FIG. 6 is a side view showing the embodiment shown in FIG. 4 and a SIM card.

FIG. 4 and FIG. 5 are a frontal view and a rear view of another embodiment of the present invention, respectively. In one embodiment of the present invention, the IC 120 is disposed at the first surface (i.e. the rear surface) and positioned between the first contact region 21 and the edge 130 having the foolproof design. The second contact 23 and the fourth contact 1102 are electrically connected to the IC 120 and the signals (e.g. data signals) therebetween are converted by the IC 120. FIG. 6 is a side view showing the embodiment shown in FIG. 4 and a SIM card.

Figure 7:
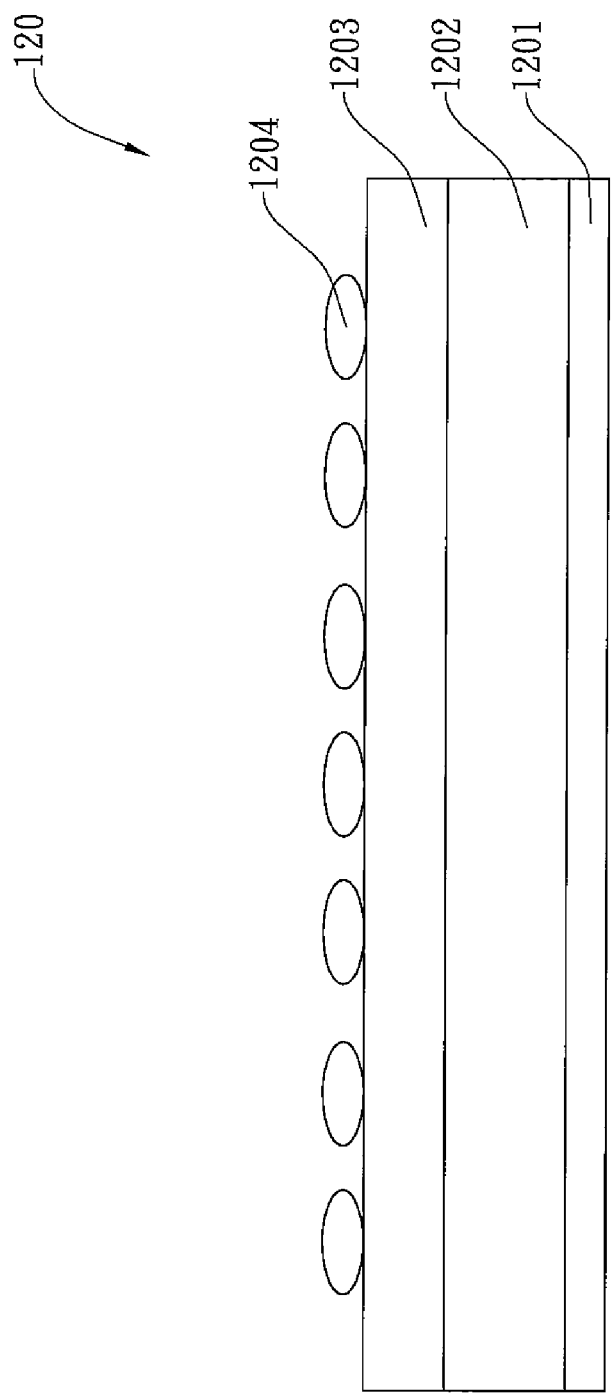
FIG. 7 is a side view of an IC fabricated using WLCSP technology of the present invention.

FIG. 7 is a side view of an IC fabricated using WLCSP technology of the present invention. The IC 120 is fabricated using WLCSP technology so as to reduce the thickness thereof, and the signals can be transmitted faster due to the die-to-substrate bonding of the IC 120. In one preferred embodiment of the present invention, the IC 120 comprises a substrate 1202, a circuit structure layer 1203 and a plurality of solder balls 1204, and one surface thereof is provided with a cover layer (CVL) 1201. In one preferred embodiment of the present invention, the thickness of the IC 120 is about 350 μm, wherein the thickness of the cover layer 1201 is about 40 μm, the combined thickness of the substrate 1202 and the circuit structure layer 1203 is about 260 μm and the thickness of each of the plurality of solder balls is about 50 μm.

Figure 8:
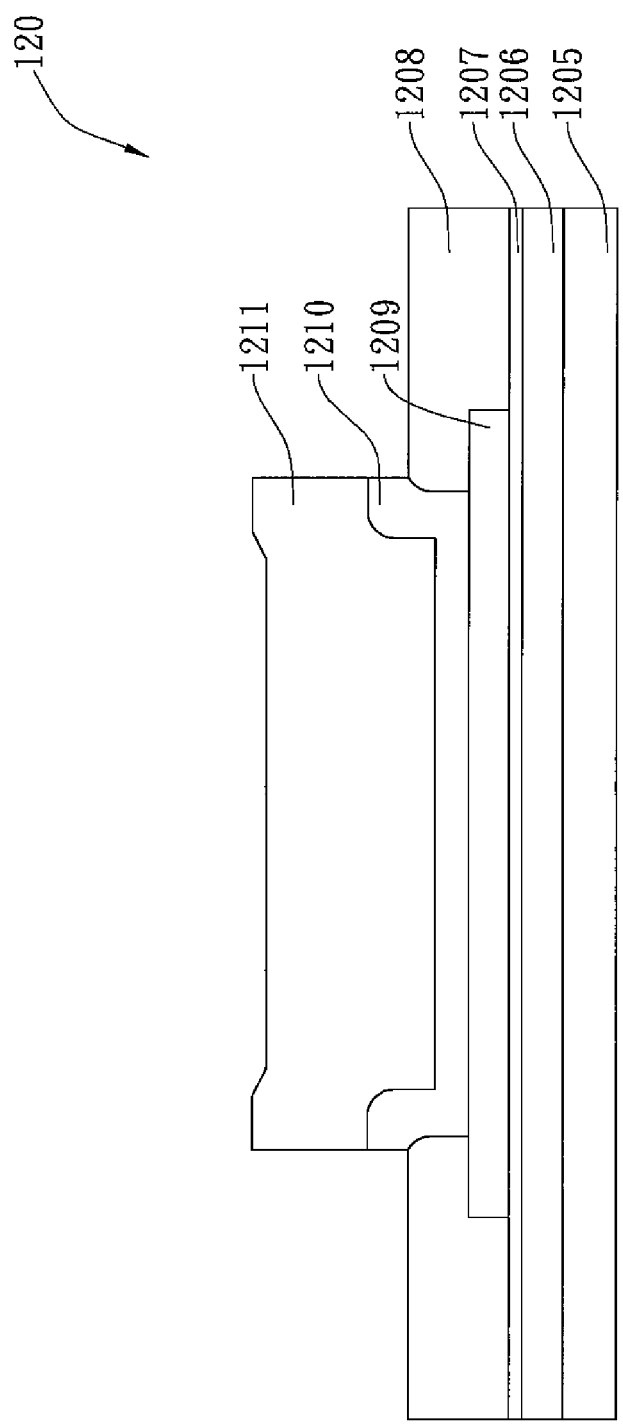
FIG. 8 is a partial side view of an IC fabricated using COF technology of the present invention.

FIG. 8 is a partial side view of an IC fabricated using COF technology of the present invention. COF technology utilizes a flexible printed circuit film as a medium for packaging a chip so as to bond the chip and the flexible substrate, or means the flexible printed circuit film with chip without package. One surface of the IC 120 can be optionally provided with a cover layer 1205. In one preferred embodiment of the present invention, the IC 120 comprises a substrate 1206, a circuit structure layer 1207, a passivation layer 1208, an aluminum pad 1209, an under bump metallization 1210, and a gold bump 1211. In one preferred embodiment of the present invention, the thickness of the IC 120 without the cover layer 1205 is about 280 μm.

According to above description, the present signal conversion device is capable of being integrated with a SIM card by adhesion without changing the structure of the SIM card, and thus is user friendly and of great convenience in use. In addition, the signal conversion device of the present invention is not limited to be applied to a SIM card, but can be applied to a USIM card.

With the detailed description of the preferred embodiments of the present invention, it will be apparent to those skilled in the art that various modifications and variations can be made to the present invention without departing from the spirit and scope of the present invention. The embodiments depicted above are not intended as limitations but rather as examples of the present invention.

What is claimed is:

1. A signal conversion device comprising:
    a substrate having a rear surface and a frontal surface, the rear surface being provided with a first contact region comprising at least a first contact and a second contact while the frontal surface being provided with a second contact region comprising at least a third contact and a fourth contact; wherein there is an electrical connection between the first and third contacts, and the second and fourth contacts are electrically connected to an IC fabricated using Wafer Level Chip Scale Package (WLCSP) technology, and wherein the IC is disposed at the rear surface or the frontal surface;
    wherein the substrate is attached to a SIM card by means of adhesion, and the first and second contacts are configured to electrically contact to the SIM card; and
    wherein a dimension of the substrate is the same as that of the SIM card so that the substrate can be completely adhered to the SIM card.

2. The signal conversion device according to claim 1, wherein the IC has a thickness not greater than 350 μm or the IC without solder balls has a thickness not greater than 260 μm.

3. The signal conversion device according to claim 1, wherein the IC has a surface provided with a cover layer, the cover layer having a thickness not greater than 40 μm.

4. The signal conversion device according to claim 1, wherein the first and third contacts electrically connect to electrical grounding.

5. The signal conversion device according to claim 1, wherein the first and third contacts electrically connect to power source.

6. The signal conversion device according to claim 1, wherein the first and second contacts are configured to electrically connect to the SIM card.

7. The signal conversion device according to claim 1, wherein the third and fourth contacts are configured to electrically connect to a portable communication device.

8. The signal conversion device according to claim 1, wherein the IC converts signals between the second and fourth contacts, and the signals are data signals.

9. A signal conversion device comprising:
    a substrate having a rear surface and a frontal surface, the rear surface being provided with a first contact region comprising at least a first contact and a second contact while the frontal surface being provided with a second contact region comprising at least a third contact and a fourth contact; wherein there is an electrical connection between the first and third contacts, and the second and fourth contacts are electrically connected to an IC fabricated using Chip On Film (COF) technology, and wherein the IC is disposed at the rear surface or the frontal surface;

wherein the substrate is attached to a SIM card by means of adhesion, and the first and second contacts are configured to electrically contact to the SIM card; and wherein a dimension of the substrate is the same as that of the SIM card so that the substrate can be completely adhered to the SIM card.

10. The signal conversion device according to claim 9, wherein the IC converts signals between the second and fourth contacts, and the signals are data signals.

11. The signal conversion device according to claim 9, wherein the IC has a thickness not greater than 280 μm.

12. The signal conversion device according to claim 9, wherein the first and third contacts electrically connect to electrical grounding.

13. The signal conversion device according to claim 9, wherein the first and third contacts electrically connect to power source.

14. The signal conversion device according to claim 9, wherein the first and second contacts are configured to electrically connect to the SIM card.

15. The signal conversion device according to claim 14, wherein the rear surface is attached to the SIM card by means of adhesion.

16. The signal conversion device according to claim 9, wherein the third and fourth contacts are configured to electrically connect to a portable communication device.

* * * * *